United States Patent [19]

Takahashi

[11] Patent Number: 5,120,991
[45] Date of Patent: Jun. 9, 1992

[54] DRIVER CIRCUIT FOR CONVERTING A CMOS LEVEL SIGNAL TO A HIGH-VOLTAGE LEVEL

[75] Inventor: Nobuyuki Takahashi, Kawasaki, Japan

[73] Assignee: Kabushiki Kaisha Toshiba, Kanagawa, Japan

[21] Appl. No.: 457,771

[22] PCT Filed: May 12, 1989

[86] PCT No.: PCT/JP89/00485
§ 371 Date: Jan. 12, 1990
§ 102(e) Date: Jan. 12, 1990

[87] PCT Pub. No.: WO89/11755
PCT Pub. Date: Nov. 30, 1989

[30] Foreign Application Priority Data

May 16, 1988 [JP] Japan ............... 63-116963

[51] Int. Cl.[5] .................... H03K 17/16
[52] U.S. Cl. .................... 307/270; 307/570; 307/242; 340/718; 340/789; 340/803; 340/811
[58] Field of Search ........... 307/370, 242, 570, 296.1; 340/718, 789, 803, 811

[56] References Cited

U.S. PATENT DOCUMENTS 4,458,159 7/1984 Konian .................... 307/296.1
4,678,943 7/1987 Uragami et al. ............ 307/570
4,851,721 7/1989 Okitaka .................... 307/571
4,942,309 7/1990 Chieli ..................... 307/570

OTHER PUBLICATIONS

L. Forbes, "Automatic On-Chip Threshold Voltage Compensation", IBM Technical Disclosure Bulletin, vol. 14, No. 10, Mar. 1972, pp. 2894-2895.

Primary Examiner—Stanley D. Miller
Assistant Examiner—Scott A. Ouellette
Attorney, Agent, or Firm—Finnegan, Henderson, Farabow, Garrett & Dunner

[57] ABSTRACT

There is disclosed a driver circuit for driving a flat panel display. In this invention, a gate bias for a MOS transistor for charging an output terminal to high level is generated by a constant voltage element. The value of a current supplied to the constant voltage element is controlled by a current control circuit. In order to turn off the charging MOS transistor, a MOS transistor for discharging the node of the gate of the charging MOS transistor is set in an ON state. In order to switch an output, two drive signals are output from a drive signal generator to turn off both the charging MOS transistor for charging the output terminal to high level and the discharging MOS transistor for discharging the output terminal to low level.

10 Claims, 6 Drawing Sheets

FIG. 7 PRIOR ART ized, the

DRIVER CIRCUIT FOR CONVERTING A CMOS LEVEL SIGNAL TO A HIGH-VOLTAGE LEVEL

TECHNICAL FIELD

The present invention relates to a driver circuit for converting a CMOS level signal to a high-voltage level and, more particularly, to a driver circuit for driving a flat panel display unit.

BACKGROUND ART

A flat panel display unit such as a plasma display is normally driven by a high voltage of about 100 V to 300 V. When such a flat panel display unit is controlled by a CMOS level signal having a logical amplitude of about 5 V, the unit cannot be directly driven by this logic signal. Therefore, a driver circuit for converting the CMOS level signal into a high-voltage level is required.

Figure 7:
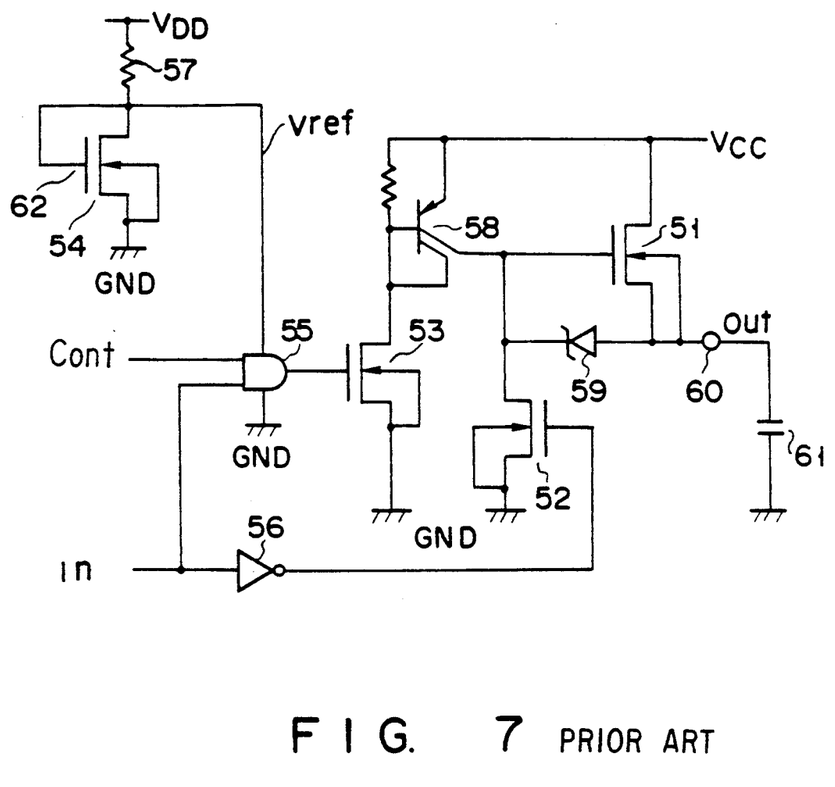
FIG. 7 is a circuit diagram showing a conventional driver circuit.

FIG. 7 is a circuit diagram showing the arrangement of a driver circuit used for the above purpose. This driver circuit possesses a function for determining the level of an output signal Out on the basis of an input signal In and a control signal cont. The circuit shown in FIG. 7 also has a function for setting the output state at a high-impedance state.

Referring to FIG. 7, reference numerals 51 to 54 denote double diffusion n-channel MOS transistors each having a structure of with a high withstand voltage; 55, a CMOS AND gate consisting of enhancement p- and n-channel MOS transistors; 56, an inverter; 57, a current setting resistor; 58, a pnp multicollector transistor; 59, a Zener diode for bias voltage generation; 60, an output terminal; and 61, a load capacitor corresponding to one segment of the flat panel display unit and connected to the output terminal 60. Reference symbol $V_{DD}$ denotes a power source voltage of, e.g., 5 V of a logical system; $V_{CC}$, a power source voltage of, e.g., 300 V for a high-voltage system; and GND, a ground voltage of 0 V for the logical and high-voltage systems. The resistor 57 and the transistor 54 constitute a reference voltage generator 62 for generating a predetermined reference voltage Vref from the power source voltage $V_{DD}$ of the logical system. The reference voltage Vref, generated by the reference voltage generator 62, is supplied to the AND gate 55 as a power source voltage. The AND gate 55 also receives the input signal In and the control signal Cont. An output from the AND gate 55 is supplied to the gate of the transistor 53.

When both the input signal In and the control signal Cont are set at "1" level, an output signal from the AND gate 55 is also set at "1" level, i.e., at the reference voltage Vref. At this time, a drain current determined by the resistance of the resistor 57 and having the same value as that of the transistor 54 flows in the transistor 53. As a result, the multicollector transistor 58 is turned ON, and a predetermined Zener voltage appears at the cathode of the Zener diode 59 as a consequence of a current flowing out from one of the collectors of the multicollector transistor 58. If the value of the Zener voltage of the Zener diode 59 is set to the threshold voltage of the transistor 51 or higher, the transistor 51 is turned ON. Thus, when both the input signal In and the control signal Cont are set at "1" level, the output signal Out is set at "1" level, i.e., the $V_{CC}$ level, by means of the ON transistor 51.

However, when both the input signal In and the control signal Cont are set at "0" level, an output signal from the AND gate 55 is set at "0" level, and the transistor 53 is turned OFF. In this case, an output signal from the inverter 56 is set at "1" level, and then the transistor 52 is turned ON. As a result, the output terminal 60 is discharged through the Zener diode 59 and the ON transistor 52, and the output signal out is set at "0" level, i.e., the GND level.

When the input signal In is set at "1" level and the control signal Cont is set at "0" level, the transistors 51 and 52 are both turned OFF, and the output signal Out is set in a high-impedance state.

In the conventional circuit described above, the reference voltage Vref is always generated by the reference voltage generator 62 and a constant current flows therethrough. For this reason, however, when the output signal Out is to be set to "1" level, current continues flowing unnecessarily through the generator 62 after the level of the output signal Out goes to the $V_{CC}$ level, resulting in energy waste.

Since, in the conventional circuit, each transistor constituting the AND gate 55 is operated by means of the voltage Vref, which is lower than the power source voltage $V_{DD}$ of 5 V for the logical system, the control range of the threshold voltage is very narrow. Because of this, it is very difficult to design an optimum circuit arrangement.

In addition, when, in the case of the conventional circuit, the output signal Out is switched from "1" level to "0" level, the transistors 51 and 52 are simultaneously turned on for a given time interval due to a delay in the cut-off operation of the transistor 51. During this time interval, a short-circuiting current flows from the power source voltage Vcc of the high-voltage system to the ground voltage GND. Since the level of the power source voltage Vcc of the high-voltage system is very high, i.e., 300 V, a considerable amount of power is consumed even when the time interval during which the short-circuiting current flows is very short. In the worst case, this short-circuiting current may cause the transistors 51 and 52 to break down.

Moreover, the conventional circuit has another disadvantage in that the switching of the output signal Out from "1" level to the high-impedance state takes place at a relatively slow speed. More specifically, when the multicollector transistor 58 is kept ON, and the output signal Out is set at "1" level, the predetermined Zener voltage is generated at the cathode of the Zener diode 59. Even if the multicollector transistor 58 is turned OFF, the cathode potential does not immediately drop, since there is no discharge path to the ground voltage at the cathode of the Zener diode 59. Thus, the timing for switching OFF the transistor 51 is drawn out, in turn increasing the time required to switch the output signal Out to the high-impedance state.

As described above, the conventional driver circuit has a number of disadvantages: current consumption is high, the control range of the threshold voltage of a transistor is very narrow, resulting in difficulties with regard to circuit design, a short-circuiting current flows between the power sources, and can easily cause transistor breakdown due to a consequent delay in transistor switching operation, with the result that the time required for switching the output signal from "1" level to the high-impedance state is increased.

The present invention has been developed in consideration of the above, and has as its object to provide a driver circuit the design of which can be optimized, the operating speed of which is increased, and wherein current consumption is reduced.

DISCLOSURE OF INVENTION

A driver circuit according to the present invention comprises a first MOS transistor having a source and a drain, one of which is connected to a first power source voltage, a diode connected between the other of the source and drain of the first MOS transistor and an output terminal, a second MOS transistor, a drain and a source of which are respectively connected to the output terminal and a ground voltage and a gate of which receives a first drive signal, a constant voltage element inserted between a gate of the first MOS transistor and the other of the source and drain of the first MOS transistor, a third MOS transistor, a drain and a source of which are respectively connected to the gate of the first MOS transistor and the ground voltage and a gate of which receives a second drive signal, a bipolar transistor, an emitter circuit of which is connected to the first power source voltage and a collector circuit of which is connected to the gate of the first MOS transistor, current control means for controlling a value of a current supplied to a base circuit of the bipolar transistor in accordance with a plurality of third drive signals, and drive signal generating means for generating the first drive signal, the second drive signal, and the plurality of third drive signals on the basis of an input signal and a control signal.

With the above arrangement, when a signal of "1" level is output from the output terminal, a current having a large value is supplied from the current control means to the base circuit of the bipolar transistor. Therefore, a current flows in the constant voltage element connected to the collector of the bipolar transistor, and a voltage drop across the constant voltage element occurs. This voltage biases the gate of the first MOS transistor to turn ON the first MOS transistor. Once the first MOS transistor is turned ON, the voltage drop across the constant voltage element can be maintained even if a large current is not supplied to the base circuit of the bipolar transistor. Therefore, after the first MOS transistor is turned ON, a current having a small value is supplied from the current control means to the base circuit of the bipolar transistor, thereby reducing current consumption.

When a signal of "0" level is output from the output terminal, the second MOS transistor is set in an ON state in response to the first drive signal.

When the first MOS transistor is turned OFF, the third MOS transistor is rendered conductive in response to the second drive signal. A gate potential of the first MOS transistor is discharged through the third MOS transistor. Therefore, the first MOS transistor is immediately turned OFF.

In addition, the drive signal generating means generates the first and second drive signals such that the third MOS transistor is turned OFF a predetermined period of time before the first MOS transistor is turned ON. At the same time, the drive signal generating means generates the first and second drive signals such that the third MOS transistor is turned ON a predetermined period of time after the first MOS transistor is turned OFF. Therefore, both the first and second MOS transistors are not simultaneously turned ON when their operating conditions are switched. Therefore, generation of a short-circuiting current between the power sources can be prevented.

BEST MODE FOR CARRYING OUT THE INVENTION

The present invention will be described in detail with reference to embodiments in conjunction with the accompanying drawings.

Figure 1:
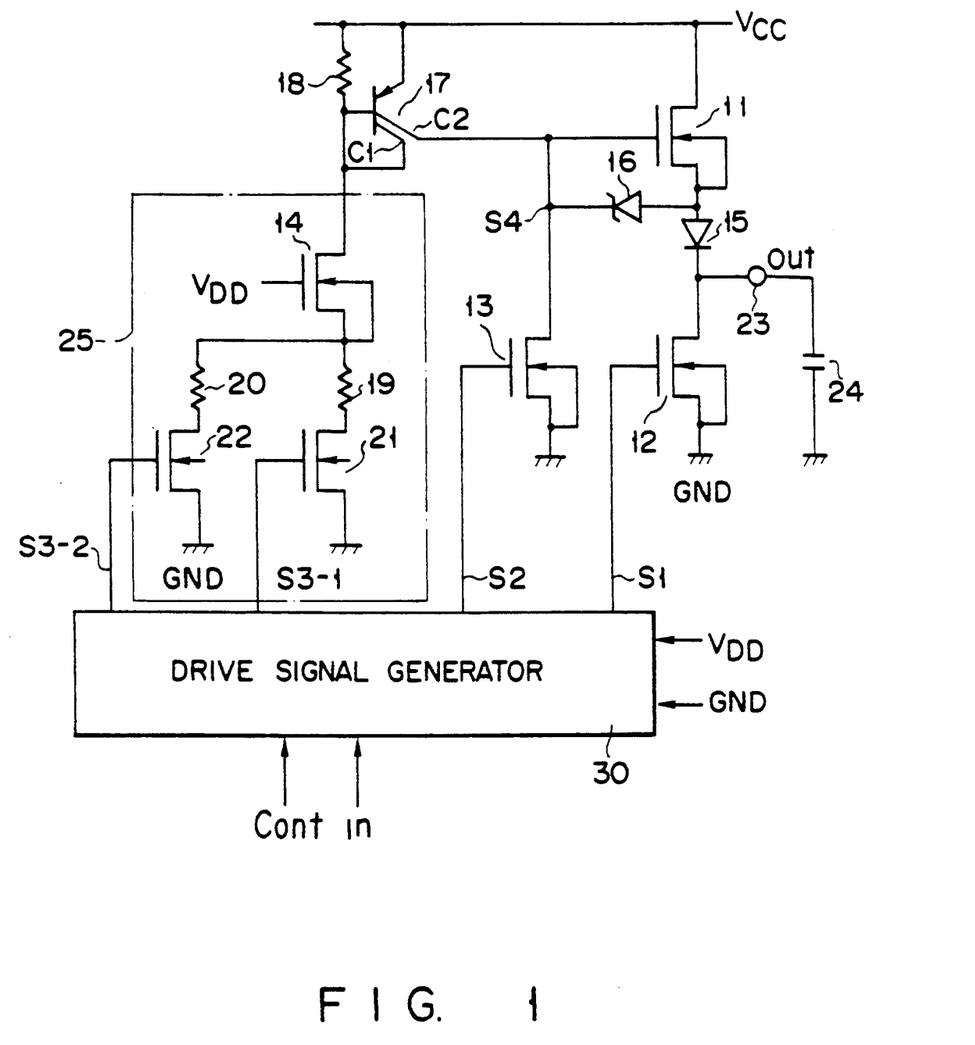
FIG. 1 is a circuit diagram showing an arrangement of a driver circuit according to an embodiment of the present invention.

FIG. 1 is a circuit diagram showing an arrangement of a driver circuit according to the first embodiment of the present invention.

Referring to FIG. 1, reference numerals 11 to 14 denote double diffusion n-channel MOS transistors (to be referred to as DMOSs hereinafter) each having a structure with a high withstand voltage; 15, an output diode; 16, a gate bias Zener diode which Zener voltage $V_Z$ is set to be the threshold voltage of the DMOS 11 or higher; 17, a level shift pnp multicollector transistor having a first collector C1 and a second collector C2; 18, a base current discharge resistor for the multicollector transistor 17; 19 and 20, current value setting resistors; 21 and 22, current switching enhancement n-channel MOS transistors; 23, an output terminal; 24, a load capacitor connected to the output terminal 23; and 30, a drive signal generator for receiving an input signal In and a control signal Cont and for generating drive signals S1 and S2 for driving the DMOSs 12 and 13 and drive signals S3-1 and S3-2 for driving the MOS transistors 21 and 22.

The drain of the DMOS 11 is connected to a power source voltage $V_{CC}$ of, e.g., 300 V for a high-voltage system. The source of the DMOS 11 is connected to the output terminal 23 through the anode and cathode of the diode 15. The gate of the DMOS 11 is connected to the cathode of the Zener diode 16. The anode of the Zener diode 16 is connected to the source of the DMOS 11.

The drain of the DMOS 12 is connected to the output terminal 23. The source of the DMOS 12 is connected to a ground voltage GND. The drain of the DMOS 13 is connected to the gate of the DMOS 11. The source of the DMOS 13 is connected to the ground voltage GND.

The emitter of the multicollector transistor 17 is connected to the power source voltage $V_{CC}$. The first collector C1 of the multicollector transistor 17 is connected to its base, and the second collector C2 is connected to the gate of the DMOS 11. The resistor 18 is connected between the base of the multicollector transistor 17 and the power source voltage $V_{CC}$.

The first collector C1 of the multicollector transistor 17 is also connected to the drain of the DMOS 14. The source of the DMOS 14 is connected to one terminal of each of the two resistors 19 and 20 having different resistances. The other terminal of each of the resistors 19 and 20 is connected to a corresponding one of the drains of the transistors 21 and 22. The sources of the transistors 21 and 22 are connected to the ground voltage GND. The resistances of the resistors 19 and 20 are set to satisfy condition R1<R2 when the resistance of the resistor 19 is represented by R1 and the resistance of the resistor 20 is represented by R2. The DMOS 14, the resistors 19 and 20, and the transistors 21 and 22 constitute the current control circuit 25 for controlling a value of a current supplied to the base of the multicollector transistor 17.

The drive signal S1 is supplied to the gate of the DMOS 12; the drive signal S2, to the gate of the DMOS 13; the power source voltage $V_{DD}$ of, e.g., 5 V for the logical system, to the gate of the DMOS 14; the drive signal S3-1, to the gate of the transistor 21; and the drive signal S3-2, to the gate of the transistor 22.

The drive signal generator 30 for generating the drive signals S1, S2, S3-1, and S3-2 receives the power source voltage $V_{DD}$ of 5 V for the logical system and the ground voltage GND of 0 V as power source voltages.

An operation of the circuit having the above arrangement will be described with reference to the timing chart shown in FIG. 2.

In the circuit of this embodiment, basically, when the control signal Cont is set at "0" level and the input signal In is set at "0" level, the output signal Out is set at "1" level ($V_{CC}$ level). When the control signal Cont is set at "0" level and the input signal In is set at "1" level, the output signal Out is set at "0" level (GND level). In addition, when the control signal Cont is set at "1" level, the output signal Out is set in the high-impedance state.

Figure 2:
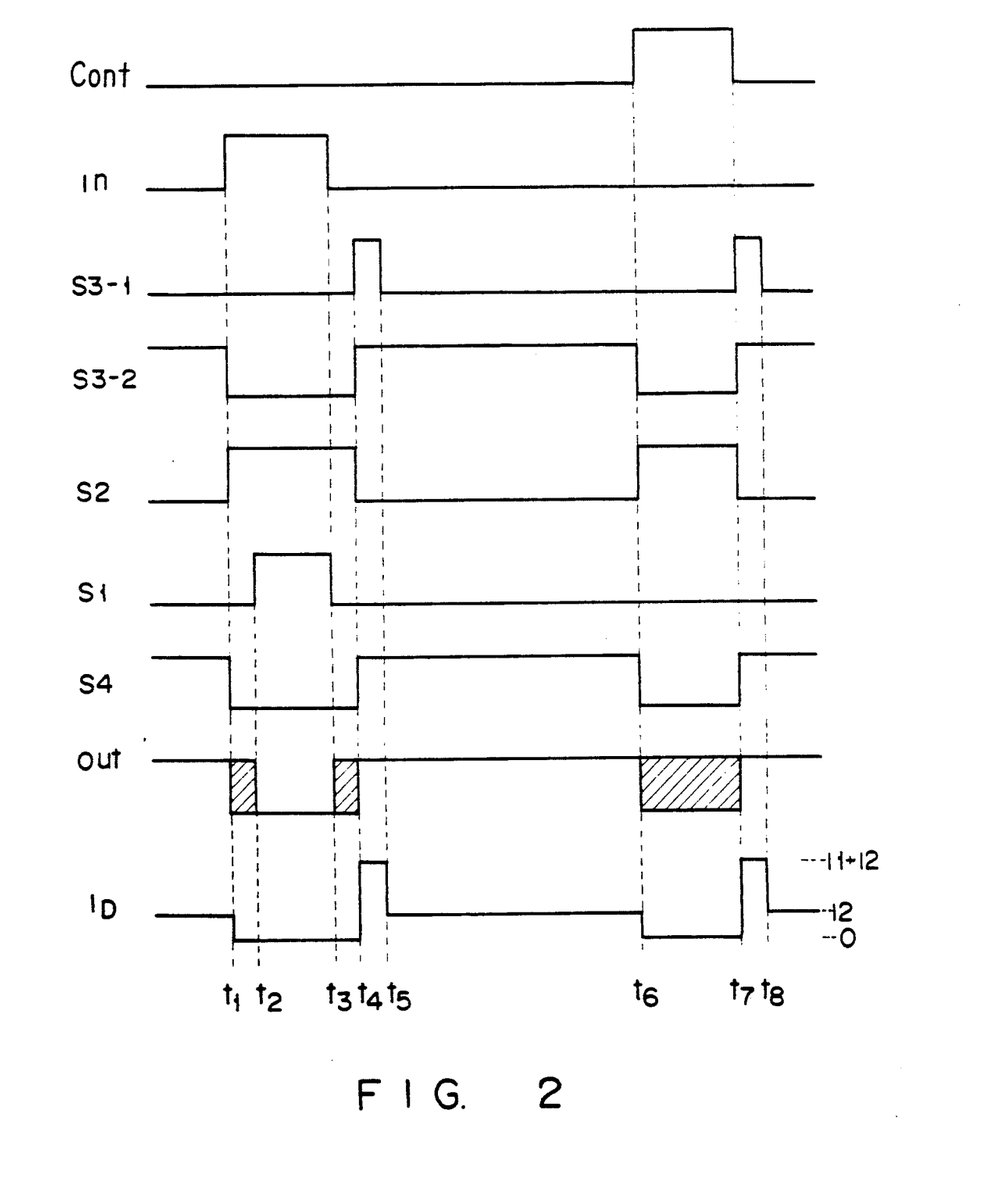
FIG. 2 is a timing chart for explaining an operation of the circuit of the embodiment shown in FIG. 1.

Referring to FIG. 2, prior to time t1 at which the input signal In is changed from "0" level to "1" level, the drive signal S3-1 is kept at "1" level within a predetermined period of time to turn on the transistor 21. The drive signal S3-2 goes to "1" level in synchronism with the leading edge of the drive signal S3-1. At the same time, the transistor 22 is turned ON. A drain current $I_D$ defined by the following equation flows in the DMOS 14 which receives the voltage $V_{DD}$ of 5 V when the threshold voltage of the DMOS 14 is given as Vth:

$$I_D = (V_{DD} - Vth)/R1 + (V_{DD} - Vth)/R2 = I1I2 \quad (1)$$

(for $I1 = (V_{DD} - Vth)/R1$ and $I2 = (V_{DD} - Vth)/R2$)

When the drain current $I_D$ flows through the DMOS 14, the multicollector transistor 17 is turned ON. At this time, a predetermined current flows into the Zener diode 16 through the transistor 17. The predetermined Zener voltage $V_Z$ is generated by the Zener diode 16. Since the Zener voltage $V_Z$ is set to be higher than the threshold voltage of the DMOS 11, the DMOS 11 is turned ON. Therefore, the load capacitor 24 is charged with the voltage $V_{CC}$ through the ON DMOS 11. The output signal Out is set at "1" level.

Thereafter, the drive signal S3-1 goes to "0" level to turn off the transistor 21. However, as the drive signal S3-2 is kept at "1" level, the transistor 22 is kept ON. At this time, a drain current $I_D$ given by the following equation is supplied to the DMOS 14:

$$I_D = (V_{DD} - Vth)/R2 = I2 \quad (2)$$

In this case, since the resistance R2 of the resistor 20 is larger than the resistance R1 of the resistor 19, the drain current $I_D$ of the DMOS 14 has a smaller amplitude. However, the gate potential of the DMOS 11 has already been set to be $V_Z$. This potential is held by a parasitic capacitance (not shown) present at this node. Therefore, a current for compensating for a voltage drop by a current leaking from the parasitic capacitance is supplied to the DMOS 11 by the transistor 22, so that the DMOS 11 is kept ON. In this manner, in the circuit of this embodiment, a sufficiently large current is supplied to the DMOS 14 only for a predetermined initial period in which the output signal Out is set at "1" level. Thereafter, a very small current is supplied to the DMOS 14. For this reason, unlike the conventional circuit, a constant current need not always be supplied to generate a reference voltage, thereby reducing current consumption.

The input signal In is changed from "0" level to "1" level at time t1. When the input signal In goes to "1" level, the drive signal S3-2 which has been set at "1" goes to "0" level. The transistor 22 is turned OFF, and the previous current does not flow in the DMOS 14. The drive signal S2 goes to "1" level after the input signal In goes to "1" level. The DMOS 13 is turned ON. The node potential of the gate of the DMOS 11 is immediately discharged to the ground voltage through the DMOS 13. For this reason, a signal S4 at the node of the gate of the DMOS 13 goes to "0" level, as shown in FIG. 2, and therefore the DMOS 11 is turned OFF. The drive signal S1 is kept at "0" level immediately after the input signal In goes to "1" level. The drive signal S1 goes to "1" level at time t2 after a lapse of a predetermined period of time from time t1. Both the DMOS 11 and the DMOS 12 are kept OFF during a time interval from time t1 to time t2. During this time interval, the output signal Out is set in a high-impedance state, as indicated by a hatched portion in FIG. 2.

At time t2, the drive signal S1 goes to "1" level. When the signal S1 is set at "1" level, the DMOS 12 is turned ON, and the output signal Out is set at the ground voltage GND, i.e., "0" level.

At time t3, the input signal In goes from "1" level to "0" level. When the input signal In goes to "0" level, the drive signal S1 rapidly goes to "0" level, and the DMOS 12 is turned OFF. At this time, the drive signal S2 is kept at "1" level, so that the DMOS 13 is kept ON, and the DMOS 11 is kept OFF.

At time t4, after a lapse of a predetermined period of time from time t3, the drive signal S2 goes to "0" level. During a time interval from time t3 to time t4, both the DMOS 11 and the DMOS 12 are kept OFF. During this time interval, the output signal Out is kept in a high-impedance state, as indicated by a hatched portion in FIG. 2.

At time t4, both the drive signals S3-1 and S3-2 go to "1" level, and both the transistors 21 and 22 are simultaneously turned ON. The drain current $I_D$, represented by equation 1 above, is supplied to the DMOS 14. As a result, the output signal Out is set at "1" level. Thereafter, at time t5, only the drive signal S3-1 goes to "0" level. At this time, the drive signal S3-2 is kept at "1" level. Therefore, after time t5, the drain current $I_D$, given by equation 2 above, is supplied to the DMOS 14 through the ON transistor 22 to keep the DMOS 11 ON. The output signal Out is kept at "1" level.

At time t6, the control signal Cont goes from "0" level to "1" level. When the signal Cont goes to "1" level, the drive signal S3-2 goes to "0" level and at the same time the drive signal S2 goes to "1" level. When the drive signal S3-2 goes to "0" level, the transistor 22 which has been kept ON is turned OFF, and the previous current is no longer supplied to the DMOS 14. That is, the drain current $I_D$ of the DMOS 14 becomes zero, as shown in FIG. 2, and no current is supplied to the Zener diode 16. When the signal S2 goes to "1" level, the DMOS 13 is turned ON. The node potential of the gate of the DMOS 11 is rapidly discharged to the ground voltage through the DMOS 13. The signal S4 goes to "0" level, as shown in FIG. 2, thereby turning OFF the DMOS 11. On the other hand, since the drive signal S1 is kept at "0" level, the DMOS 12 is kept OFF. Therefore, when the control signal Cont is changed to "1" level, the output signal Out is set in a high-impedance state, as indicated by a hatched portion in FIG. 2. In this manner, when the output signal Out is changed from "1" level to the high-impedance state, the DMOS 13 is turned ON. The cathode potential of the Zener diode 16 is rapidly discharged to the GND through the DMOS 13. As a result, the DMOS 11 is immediately turned OFF to advance the timing at which the output signal Out is changed to the high-impedance state. This state continues until time t7 at which the next control signal Cont is changed to "0" level.

At time t7, when the control signal Cont is changed from "1" level to "0" level, both the drive signals S3-1 and S3-2 go to "1" level and the output signal Out is set at "1" level, in the same manner as at time t4. Thereafter, at time t8, only the drive signal S3-1 goes to "0" level to turn OFF the transistor 21. At this time, the output signal Out is kept at "1" level.

Figure 3:
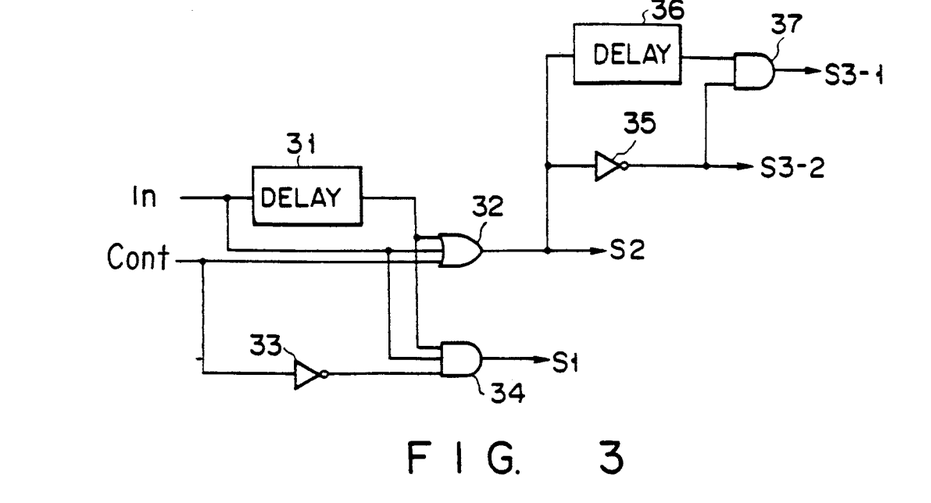
FIG. 3 is a circuit diagram showing a detailed arrangement of a drive signal generator used in the circuit of the embodiment shown in FIG. 1.

The drive signal generator 30, for receiving the input signal In and the control signal Cont and for generating the drive signals S1, S2, S3-1, and S3-2 at timings shown in FIG. 2 can, be easily arranged using known logical gate circuits and signal delay circuits. A detailed arrangement of such as circuit is shown in FIG. 3. Referring to FIG. 3, the input signal In is input to an OR gate 32 through a delay circuit 31 for delaying the input signal In by a predetermined period of time. The OR gate 32 directly receives the input signal In and the control signal Cont. The OR gate 32 outputs the drive signal S2. The input signal In is supplied to an AND gate 34 through an inverter 33. The AND gate 34 receives the input signal In and an output signal from the delay circuit 31. The AND gate 34 outputs the drive signal S1. The drive signal S2 is supplied to an inverter 35. The inverter 35 outputs the drive signal S3-2. The drive signal S2 is supplied to an AND gate 37 through a delay circuit 36 for delaying this signal by a predetermined period of time. The AND gate 37 also receives the drive signal S2. The AND gate 37 outputs the drive signal S3-1.

The logical gate circuits and signal delay circuits in the drive signal generator 30 having the above arrangement receive $V_{DD}$ and GND as power source voltages.

Figure 4:
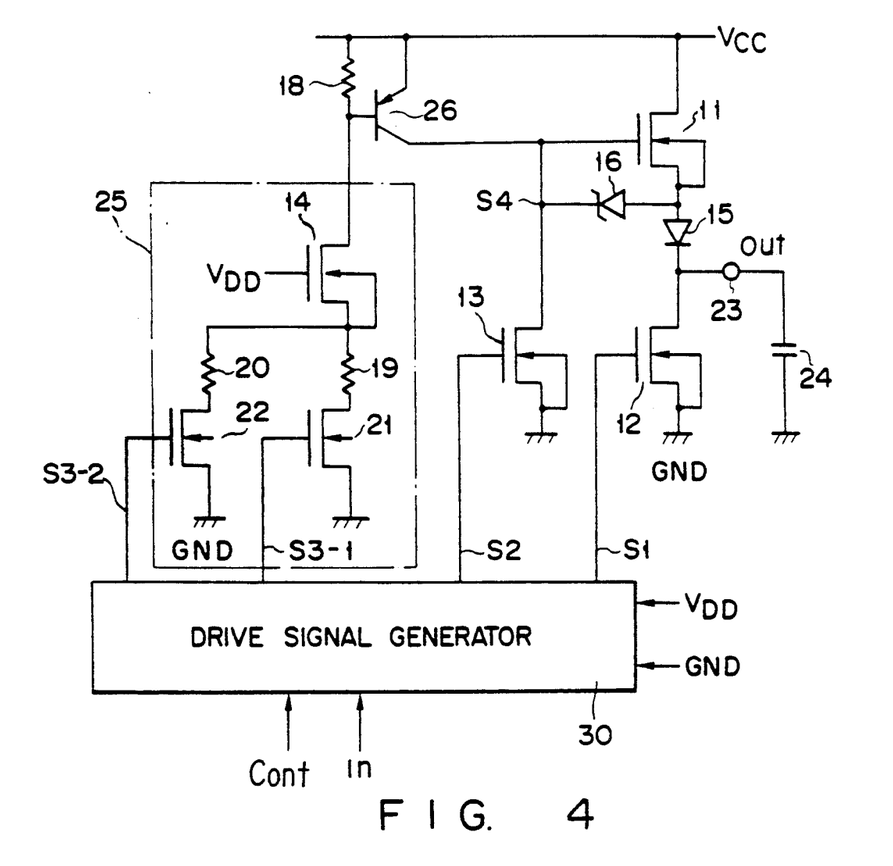
FIGS. 4 to 6 are circuit diagrams showing arrangements of further embodiments of the present invention.

FIG. 4 is a circuit diagram showing an arrangement of a driver circuit according to the second embodiment of the present invention. The circuit of this embodiment uses a pnp transistor 26 having a single collector in place of the multicollector transistor 17 in the circuit of the embodiment shown in FIG. 1. In this case, the collector of the transistor 26 is connected to the gate of the DMOS 11, and the base is connected to the drain of the DMOS 14 of the current control circuit 25. The resistor 18 is connected between the of transistor 26 and the voltage $V_{CC}$.

Figure 5:
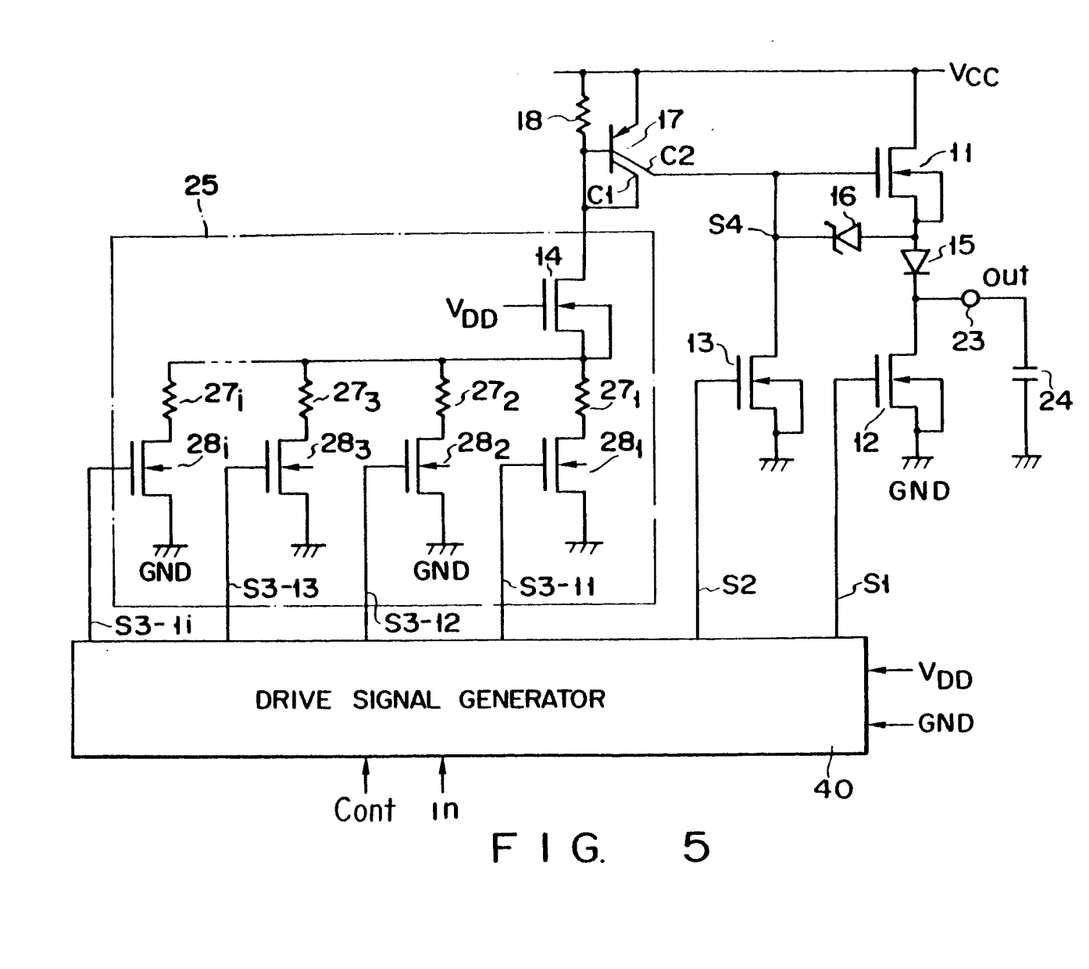

FIG. 5 is a circuit diagram showing an arrangement of a driver circuit according to the third embodiment of the present invention. In the circuit of the third embodiment, the current control circuit 25 includes i (i is an integer of 2 or more) resistors $27_1$, $27_2$, $27_3$, ... $27_i$ having different resistances. These resistors $27_1$ to $27_i$ are controlled by enhancement transistors $28_1$, $28_2$, $28_3$, ... $28_i$ in accordance with drive signals S2-11, S2-12, S2-13, ... S3-1i generated by a drive signal generator 40. Drain currents having different values, the number of which is larger than two, are supplied to a DMOS 14. In this case, therefore, the value of a current supplied to a Zener diode 16 can be finely controlled in accordance with a change in state of a load connected to an output terminal 23.

Figure 6:
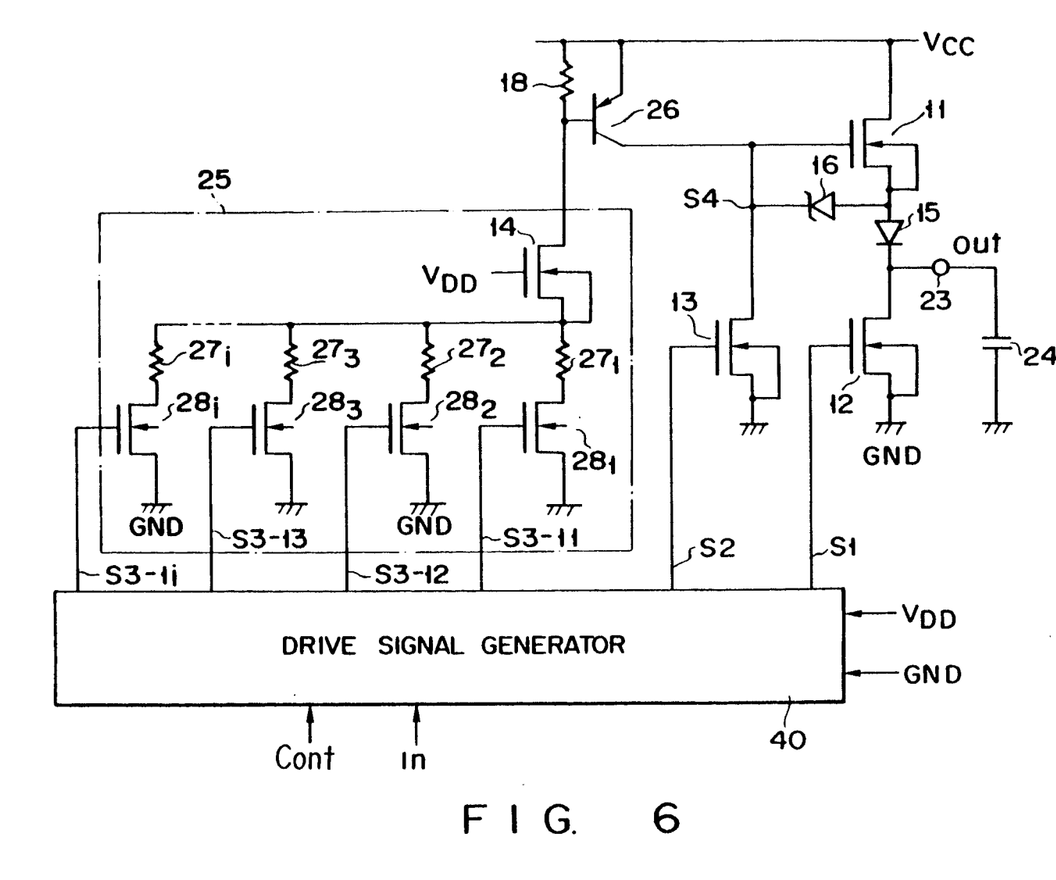

FIG. 6 is a circuit diagram showing an arrangement of a driver circuit according to the fourth embodiment of the present invention. The circuit of the fourth embodiment uses a pnp transistor 26 having a single collector in place of the multicollector transistor 17 shown in the circuit of the embodiment shown in FIG. 5.

The drive signal generators 40 used in the circuits of the embodiments of FIGS. 5 and 6 to generate the drive signals S1 and S2 and the drive signals S3-1 to S3-i can be easily arranged by using known logical gate circuits and signal delay circuits. Industrial Applicability The driver circuit according to the present invention can be effectively utilized in a driver circuit for driving a flat panel display with a high voltage.

I claim:

1. A driver circuit comprising:
   a first MOS transistor having a source, a gate, and a drain, one of the source and drain being connected to a first power source voltage;
   a diode connected between the other of said source and drain of said first MOS transistor and an output terminal;
   a second MOS transistor having a source, a gate, and a drain, the drain and the source being respectively connected to said output terminal and a ground voltage, and the gate receiving a first drive signal;
   a constant voltage element inserted between the gate of said first MOS transistor and the other of said source and drain of said first MOS transistor;
   a third MOS transistor having a source, a gate, and a drain, the drain and the source being respectively connected to said gate of said first MOS transistor and the ground voltage, and the gate receiving a second drive signal;
   a bipolar transistor having an emitter, a collector, and a base, wherein the emitter is connected to the first power source voltage and the collector is connected to said gate of said first MOS transistor;
   current control means, for controlling a value of current supplied to the base of said bipolar transistor in accordance with a plurality of third drive signals; and
   drive signal generating means, for generating the first drive signal, the second drive signal, and the plurality of third drive signals on the basis of an input signal and a control signal.

2. A driver circuit according to claim 1, wherein said first, second, and third MOS transistors are double diffusion n-channel MOS transistors.

3. A driver circuit according to claim 1, wherein said constant voltage element is a Zener diode, an anode of which is connected to the other of said source and drain of said first MOS transistor and a cathode of which is connected to said gate of said first MOS transistor.

4. A driver circuit according to claim 1, wherein said current control means comprises:
- a fourth MOS transistor having a source, a gate, and a drain, wherein one of the source and drain is connected to said base of said bipolar transistor, and the gate receives a second power source voltage;
- a plurality of first resistors, each having a first terminal connected to the other of said source and drain of said fourth MOS transistor, said plurality of first resistors each having different resistances; and
- a plurality of fifth MOS transistors, each having a source, a gate, and a drain, wherein one of said source and drain is connected to a second terminal of a corresponding one of said plurality of first resistors, the other of said source and drain of said plurality of fifth MOS transistors is connected to the ground voltage, and wherein each gate of said plurality of fifth MOS transistors receives one of said plurality of third drive signals.

5. A driver circuit according to claim 4, wherein said current control means includes two of said plurality of first resistors to supply different three-value currents, including a current value of zero to said base circuit of said bipolar transistor.

6. A driver circuit according to claim 4, wherein said fourth MOS transistor is a double diffusion n-channel MOS transistor, and said plurality of fifth MOS transistors are enhancement n-channel MOS transistors.

7. A driver circuit according to claim 1, wherein said drive signal generating means generates the second drive signal to turn ON said third MOS transistor in synchronism with a timing at which said second MOS transistor is maintained in an OFF state in response to the first drive signal.

8. A driver circuit according to claim 7, wherein said drive signal generating means generates the first and second drive signals to turn ON said third MOS transistor a predetermined period of time before turn-on of said second MOS transistor, and generates the first and second drive signals to turn OFF said third MOS transistor a predetermined period of time after turn-off of said second MOS transistor.

9. A driver circuit according to claim 4, wherein said bipolar transistor is a pnp multicollector transistor having first and second collectors, said pnp multicollector transistor having an emitter which is connected to the first power source voltage, and a base which is connected to said first collector and one of said source and drain of said fourth MOS transistor, said second collector being connected to said gate of said first MOS transistor, a second resistor being connected between said base of said multicollector transistor and the first power source voltage.

10. A driver circuit according to claim 4, wherein said bipolar transistor is a pnp transistor having a single collector, said pnp transistor having an emitter which is connected to the first power source voltage and a base which is connected to one of said source and drain of said fourth MOS transistor, said single collector being connected to said gate of said first MOS transistor, a second resistor being connected to said base of said pnp transistor and the first power source voltage.

* * * * *